US005566311A

United States Patent [19]

Gochi

[11] Patent Number: 5,566,311

[45] Date of Patent: Oct. 15, 1996

[54] SEMICONDUCTOR MEMORY CONTROLLER FOR REDUCING PASS THROUGH CURRENT

[75] Inventor: Hidenobu Gochi, Itami, Japan

[73] Assignee: Mitsubishi Denki Kabushiki Kaisha, Tokyo, Japan

[21] Appl. No.: 264,712

[22] Filed: Jun. 23, 1994

[30] Foreign Application Priority Data

Jun. 25, 1993 [JP] Japan .................................... 5-155699

[51] Int. Cl.$^{6}$ ...................................................... G06F 13/00

[52] U.S. Cl. ........................ 395/405; 364/254.4; 364/254; 364/259.9; 364/DIG. 1

[58] Field of Search .................................... 395/800, 425, 395/405; 365/230.03, 230.06

[56] References Cited

U.S. PATENT DOCUMENTS

| | | | |
|---|---|---|---|
| 4,665,506 | 5/1987 | Cline | 365/189 |
| 5,005,157 | 4/1991 | Catlin | 365/193 |
| 5,016,223 | 5/1991 | Kimura | 365/229 |
| 5,161,218 | 11/1992 | Catlin | 395/425 |
| 5,175,835 | 12/1992 | Beighe | 395/425 |
| 5,237,692 | 8/1993 | Raasch | 395/725 |
| 5,274,788 | 12/1993 | Koike | 395/484 |
| 5,287,464 | 2/1994 | Kumar | 395/309 |
| 5,315,549 | 5/1994 | Scherpenberg | 365/189.09 |
| 5,333,295 | 7/1994 | Podkowa | 395/425 |
| 5,341,494 | 8/1994 | Thayer | 394/425 |
| 5,353,431 | 10/1994 | Doyle | 395/425 |
| 5,363,001 | 11/1994 | Vinal | 365/189.05 |
| 5,367,494 | 11/1994 | Shebanow | 365/230.03 |
| 5,390,350 | 2/1995 | Chung | 395/150 |
| 5,392,252 | 2/1995 | Rimpo | 365/230.02 |
| 5,497,351 | 3/1996 | Oowaki | 365/230.03 |

FOREIGN PATENT DOCUMENTS

| | | |
|---|---|---|
| 63-228281 | 9/1988 | Japan . |
| 1290093 | 11/1988 | Japan . |
| 2-89274 | 3/1990 | Japan . |
| 2-146656 | 6/1990 | Japan . |
| 2-232793 | 9/1990 | Japan . |
| 4-139552 | 5/1992 | Japan . |

OTHER PUBLICATIONS

"Boost 68020 Systems with Dram Controller Simplify Interfacing And Reduce Design Time For 32–Bit Microprocessors"; Electronic Design; Sep. 28, 1989; pp. 61–72.

"High–Speed Compact Circuits with CMOS"; Krambeck et al.; IEEE Journal of Solid–State Circuits, vol. SC–17, No. 3, Jun. 1982, pp. 614–619.

"1–Mbit DRAM controller shuns complex timing and protocol to streamline high–speed systems"; Zwie Amitai; Electronic Design, May 1, 1986, pp. 239–244.

*Primary Examiner*—Eric Coleman
*Attorney, Agent, or Firm*—Leydig, Voit & Mayer

[57] ABSTRACT

In a semiconductor memory controller there are provided in parallel N-bit even number and odd number byte address decoder circuits, a 2N-bit address decoder circuit, even number and odd number byte subaddress decoder circuits for semiconductor memories having smaller capacities than semiconductor memories connected to the even and odd number byte subaddress decoder circuits and the 2N-bit address decoder circuit. The semiconductor memories are controlled to form a continuous address space. Signal levels are controlled by a pass through current preventing input buffer circuit, a three state output buffer circuit, and a backup state control circuit. Thereby, semiconductor memories different from each other in volatile/non-volatile type, memory capacity, and data bus width can be controlled even in a mixed state and unnecessary power consumption due to pass through power is significantly reduced.

10 Claims, 11 Drawing Sheets

RST
AD
CSE1
CSE2
WE
WP
BACKUP STATE CONTROL CIRCUIT
PASS THROUGH CURRENT PREVENTING BUFFER CIRCUIT (FIRST INPUT BUFFER CIRCUIT)
OPERATION STATE DETECTING CIRCUIT
ADDRESS BUS BUFFER CIRCUIT
EVEN NUMBER BYTE ADDRESS DECODER CIRCUIT
ODD NUMBER BYTE ADDRESS DECODER CIRCUIT
2N-BIT SELECT ADDRESS DECODER CIRCUIT
EVEN NUMBER BYTE SUBADDRESS DECODER CIRCUIT
ODD NUMBER BYTE SUBADDRESS DECODER CIRCUIT
PASS THROUGH CURRENT PREVENTING BUFFER CIRCUIT (SECOND INPUT BUFFER CIRCUIT)
WRITE SIGNAL CONTROL CIRCUIT
THREE STATE OUTPUT BUFFER CIRCUIT

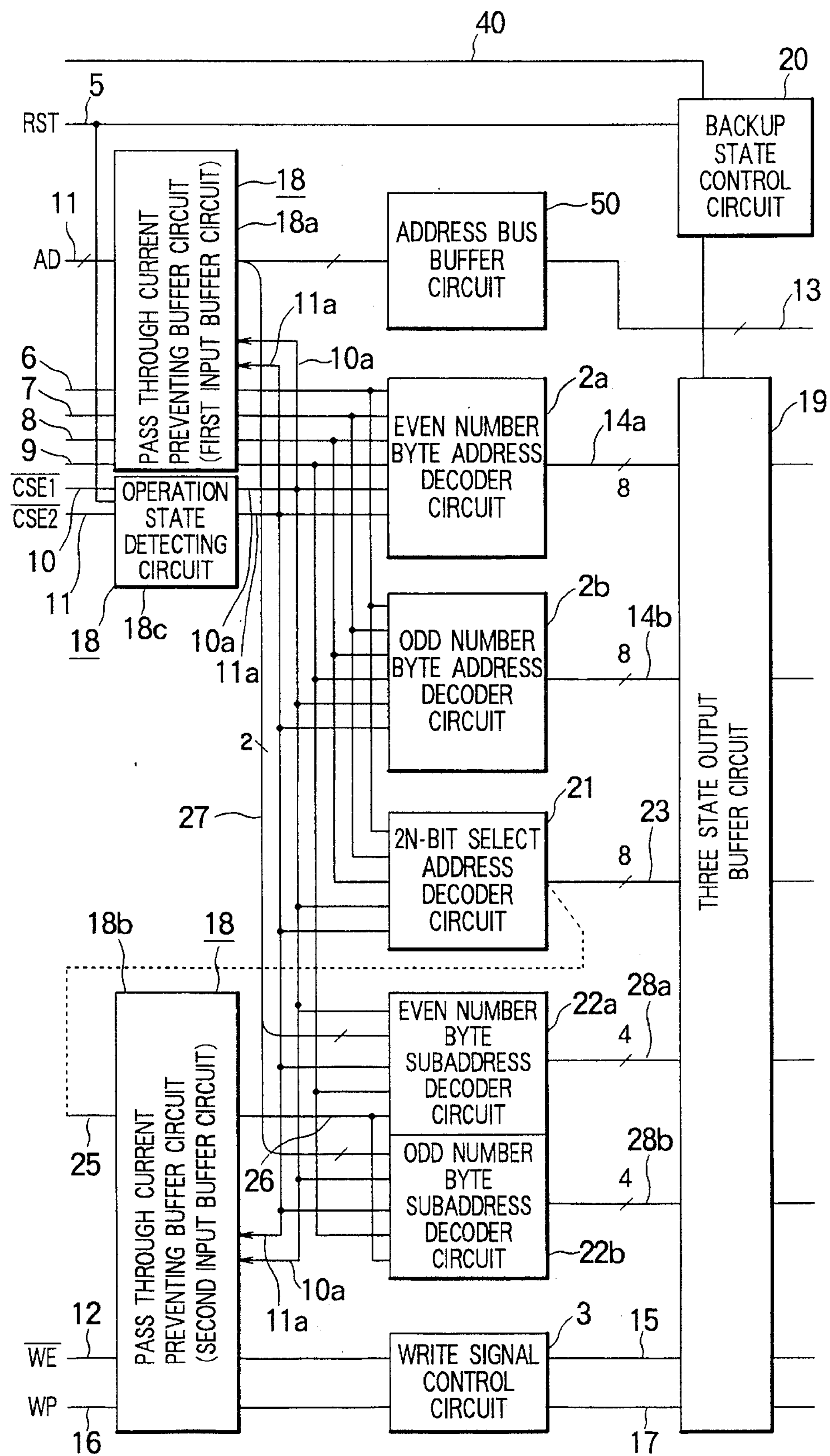
FIG. 1
40
20
5
RST
BACKUP STATE CONTROL CIRCUIT
18
18a
50
11
AD
ADDRESS BUS BUFFER CIRCUIT
13
11a
10a
PASS THROUGH CURRENT PREVENTING BUFFER CIRCUIT (FIRST INPUT BUFFER CIRCUIT)
6
7
8
9
2a
EVEN NUMBER BYTE ADDRESS DECODER CIRCUIT
14a
19
8
CSE1
CSE2
OPERATION STATE DETECTING CIRCUIT
10
11
18
18c
10a
11a
2b
ODD NUMBER BYTE ADDRESS DECODER CIRCUIT
14b
8
2
27
21
2N-BIT SELECT ADDRESS DECODER CIRCUIT
23
8
THREE STATE OUTPUT BUFFER CIRCUIT
18b
18
22a
EVEN NUMBER BYTE SUBADDRESS DECODER CIRCUIT
28a
4
25
26
ODD NUMBER BYTE SUBADDRESS DECODER CIRCUIT
28b
4
22b
PASS THROUGH CURRENT PREVENTING BUFFER CIRCUIT (SECOND INPUT BUFFER CIRCUIT)
10a
11a
12
WE
3
WRITE SIGNAL CONTROL CIRCUIT
15
WP
16
17

FIG. 4

| LEAST SIGNIFICANT BIT DECODER INPUT SIGNAL (9) | DECODER INPUT SIGNAL (6) | DECODER INPUT SIGNAL (7) | DECODER INPUT SIGNAL (8) | ACTIVE OUTPUT AMONG MCSA0 TO MCSA7 (14a) (EVEN NUMBER BYTE ADDRESS DECODER CIRCUIT 2a) | ACTIVE OUTPUT AMONG MCSB0 TO MCSB7 (14b) (ODD NUMBER BYTE ADDRESS DECODER CIRCUIT 2b) | ACTIVE OUTPUT AMONG MCSW0 TO MCSW7 (23) (2N-BIT SELECT ADDRESS DECODER CIRCUIT 21) |
|---|---|---|---|---|---|---|
| L | L | L | L | MCSA0 | (NONE) | MCSW0 |
| H | L | L | L | (NONE) | MCSB0 | MCSW0 |
| L | H | L | L | MCSA1 | (NONE) | MCSW1 |
| H | H | L | L | (NONE) | MCSB1 | MCSW1 |
| L | L | H | L | MCSA2 | (NONE) | MCSW2 |
| H | L | H | L | (NONE) | MCSB2 | MCSW2 |
| L | H | H | L | MCSA3 | (NONE) | MCSW3 |
| H | H | H | L | (NONE) | MCSB3 | MCSW3 |
| L | L | L | H | MCSA4 | (NONE) | MCSW4 |
| H | L | L | H | (NONE) | MCSB4 | MCSW4 |
| L | H | L | H | MCSA5 | (NONE) | MCSW5 |
| H | H | L | H | (NONE) | MCSB5 | MCSW5 |
| L | L | H | H | MCSA6 | (NONE) | MCSW6 |
| H | L | H | H | (NONE) | MCSB6 | MCSW6 |
| L | H | H | H | MCSA7 | (NONE) | MCSW7 |
| H | H | H | H | (NONE) | MCSB7 | MCSW7 |

OPERATION TABLE WHEN $\overline{CSE1}$=L AND $\overline{CSE2}$=H

FIG. 6

| LEAST SIGNIFICANT BIT DECODER INPUT SIGNAL (9) | DECODER INPUT SIGNAL (6) | DECODER INPUT SIGNAL (7) | DECODER INPUT SIGNAL (8) | ACTIVE OUTPUT AMONG MCSA0 TO MCSA7 (14a) (EVEN NUMBER BYTE ADDRESS DECODER CIRCUIT 2a) | ACTIVE OUTPUT AMONG MCSB0 TO MCSB7 (14b) (ODD NUMBER BYTE ADDRESS DECODER CIRCUIT 2b) | ACTIVE OUTPUT AMONG MCSW0 TO MCSW7 (23) (2N-BIT SELECT ADDRESS DECODER CIRCUIT 21) |
|---|---|---|---|---|---|---|
| L | L | L | L | (NONE) | MCSB0 | MCSW0 |
| H | L | L | L | (NONE) | MCSB0 | MCSW0 |
| L | H | L | L | (NONE) | MCSB1 | MCSW1 |
| H | H | L | L | (NONE) | MCSB1 | MCSW1 |
| L | L | H | L | (NONE) | MCSB2 | MCSW2 |
| H | L | H | L | (NONE) | MCSB2 | MCSW2 |
| L | H | H | L | (NONE) | MCSB3 | MCSW3 |
| H | H | H | L | (NONE) | MCSB3 | MCSW3 |
| L | L | L | H | (NONE) | MCSB4 | MCSW4 |
| H | L | L | H | (NONE) | MCSB4 | MCSW4 |
| L | H | L | H | (NONE) | MCSB5 | MCSW5 |
| H | H | L | H | (NONE) | MCSB5 | MCSW5 |
| L | L | H | H | (NONE) | MCSB6 | MCSW6 |
| H | L | H | H | (NONE) | MCSB6 | MCSW6 |
| L | H | H | H | (NONE) | MCSB7 | MCSW7 |
| H | H | H | H | (NONE) | MCSB7 | MCSW7 |

OPERATION TABLE WHEN $\overline{CSE1}=H$ AND $\overline{CSE2}=L$

FIG. 7

| LEAST SIGNIFICANT BIT DECODER INPUT SIGNAL (9) | DECODER INPUT SIGNAL (6) | DECODER INPUT SIGNAL (7) | DECODER INPUT SIGNAL (8) | (EVEN NUMBER BYTE ADDRESS DECODER CIRCUIT 2a) ACTIVE OUTPUT AMONG MCSA0 TO MCSA7 (14a) | (ODD NUMBER BYTE ADDRESS DECODER CIRCUIT 2b) ACTIVE OUTPUT AMONG MCSB0 TO MCSB7 (14b) | (2N-BIT SELECT ADDRESS DECODER CIRCUIT 21) ACTIVE OUTPUT AMONG MCSW0 TO MCSW7 (23) |
|---|---|---|---|---|---|---|
| L | L | L | L | MCSA0 | MCSB0 | MCSW0 |
| H | L | L | L | MCSA0 | MCSB0 | MCSW0 |
| L | H | L | L | MCSA1 | MCSB1 | MCSW1 |
| H | H | L | L | MCSA1 | MCSB1 | MCSW1 |
| L | L | H | L | MCSA2 | MCSB2 | MCSW2 |
| H | L | H | L | MCSA2 | MCSB2 | MCSW2 |
| L | H | H | L | MCSA3 | MCSB3 | MCSW3 |
| H | H | H | L | MCSA3 | MCSB3 | MCSW3 |
| L | L | L | H | MCSA4 | MCSB4 | MCSW4 |
| H | L | L | H | MCSA4 | MCSB4 | MCSW4 |
| L | H | L | H | MCSA5 | MCSB5 | MCSW5 |
| H | H | L | H | MCSA5 | MCSB5 | MCSW5 |
| L | L | H | H | MCSA6 | MCSB6 | MCSW6 |
| H | L | H | H | MCSA6 | MCSB6 | MCSW6 |
| L | H | H | H | MCSA7 | MCSB7 | MCSW7 |
| H | H | H | H | MCSA7 | MCSB7 | MCSW7 |

OPERATION TABLE WHEN $\overline{CSE1}$ = L AND $\overline{CSE2}$ = L

FIG. 8

| 5 | 10 | 11 | 25 | ADDRESS INPUT 27 | | 9 | OPERATION |
|---|---|---|---|---|---|---|---|
| L | X | X | X | X | X | X | OUTPUTS OF ADDRESS DECODER CIRCUITS ARE ALL SET IN "H" LEVEL |
| H | H | H | L | X | X | X | |
| H | X | X | H | X | X | X | |
| H | L | H | L | X | X | L | EACH OF OUTPUTS FROM EVEN NUMBER BYTE SUBADDRESS DECODER CIRCUIT 22a IS SET TO "L" STATE IN ACCORDANCE WITH ADDRESS INPUT 27 AND IS SELECTED |
| H | L | H | L | X | X | L | EACH OF OUTPUTS FROM ODD NUMBER BYTE SUBADDRESS DECODER CIRCUIT 22b IS SET TO "L" STATE IN ACCORDANCE WITH ADDRESS INPUT 27 AND IS SELECTED |
| H | H | L | L | X | X | X | |
| H | L | L | L | X | X | X | ONE OF OUTPUTS FROM EACH OF EVEN NUMBER AND ODD NUMBER BYTE SUBADDRESS DECODER CIRCUITS IS SET TO "L" STATE RESPECTIVELY IN ACCORDANCE WITH ADDRESS INPUT 27 AND IS SELECTED |

FIG. 9
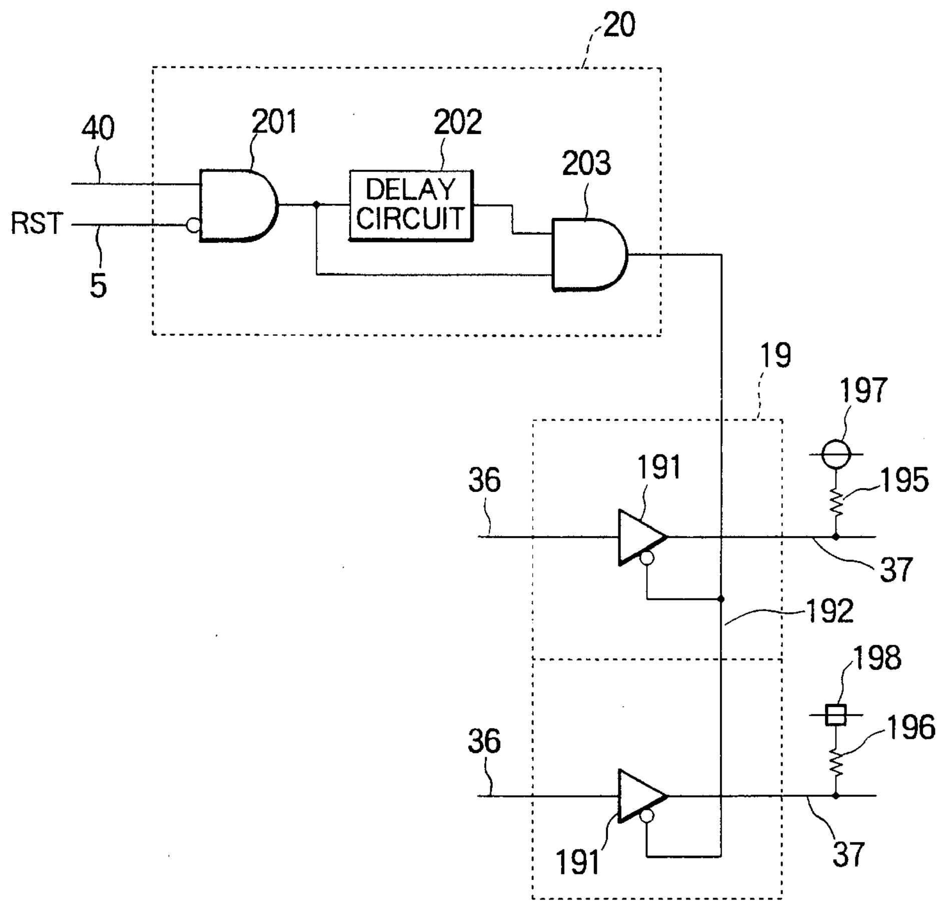
FIG.10A
OUTPUT OF 201
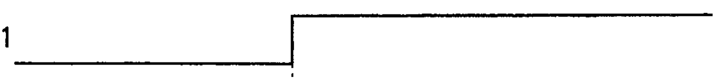
FIG.10B
OUTPUT OF 202
FIG.10C
OUTPUT OF 203
FIG.10D
"Hz" STATE
OUTPUT OF 191
T1
T2

FIG. 13

| 5 | 10 | 11 | 6 | 7 | 8 | 9 | OPERATION |
|---|---|---|---|---|---|---|---|
| L | X | X | X | X | X | X | ALL OUTPUTS ARE SET IN "H" LEVEL |
| H | H | H | X | X | X | X | |
| H | L | H | X | X | X | L | ONE AMONG OUTPUTS FROM EVEN NUMBER BYTE SUBADDRESS DECODER CIRCUIT IS SET IN "L" LEVEL |
| H | L | H | X | X | X | H | ONE AMONG OUTPUTS FROM ODD NUMBER BYTE SUBADDRESS DECODER CIRCUIT IS SET IN "L" LEVEL |
| H | L | L | X | X | X | X | ONE OF OUTPUTS FROM EACH OF EVEN NUMBER AND ODD NUMBER BYTE SUBADDRESS DECODER CIRCUITS IS SET TO "L" LEVEL RESPECTIVELY |

SEMICONDUCTOR MEMORY CONTROLLER FOR REDUCING PASS THROUGH CURRENT

BACKGROUND OF THE INVENTION

1. Field of the Invention

The present invention relates to a semiconductor memory controller which controls the operation of a plurality of semiconductor memories in a device such as an IC card.

2. Description of Related Art

FIG. 11 is a circuitry block diagram showing a conventional semiconductor memory controller. In the figure, a reference numeral 1 denotes an address buffer circuit; 2*a* an even number byte address decoder circuit; 2*b* an odd number byte address decoder circuit; and 3 a write signal control circuit for controlling a write enable signal line ($\overline{WE}$) 12 and a write protect signal line (WP) 16. In addition, a reference numeral 4 denotes an address input bus (AD) on which an address signal is supplied; 5 a reset signal line (RST); 6 to 9 address decoder signal input lines; and 10 and 11 denote first and second chip select enable signal lines ($\overline{CSE1}$ and $\overline{CSE2}$), respectively. Further, a reference numeral 13 denotes an address output bus for outputting an address signal; 14*a* a group of even number byte address decoder output lines including 8 output lines; 14*b* a group of odd number byte address decoder output lines including 8 output lines, similarly; 15 a write enable signal output line; and 17 a write protect signal output line.

An input side is on the left side of FIG. 11 and external signals are inputted to the signal lines denoted by the reference numerals 4 to 12 and 16. The signal lines denoted by the reference numerals 13, 14*a*, 14*b* and 15 on the right side of FIG. 11 are of the output side and a plurality of semiconductor memories not shown are connected to these output signal lines to be controlled. The write protect signal output line 17 is used as a signal for indicating the status of the controller. It should be noted that a signal line is indicated with the same reference numeral as that of a signal transferred on the signal line in the following description.

The controller is of a byte address system and can selectively perform one of an N-bit operation and a 2N-bit operation. 16 (8×2) semiconductor memories (not shown) can be totally connected to the group 14*a* of even number byte address decoder output lines and the group 14*b* of odd number byte address decoder output lines. Each of the address decoder output lines is connected to, for example, a chip enable terminal of the semiconductor memory to set the connected memory in an active state by giving a signal of a predetermined level. A signal of the write enable signal output line 15 is connected to the write enable terminal of each of the semiconductor memories to set the semiconductor memories in a write enable state. The address output bus 13 is connected to the respective semiconductor memories to designate one address in the semiconductor memories.

The first and second chip select enable signals 10 and 11 are for switching the operation between the N-bit operation and the 2N-bit operation. The address decoder signals 6, 7 and 8 designate to which output lines of the address decoder output line groups 14*a* and 14*b* of the address decoder circuits 2*a* and 2*b* are to supply the enable signals, respectively. The address signal 4 further designate one address of each of the semiconductor memories. The address decoder signal input line 9 selects one of the odd number byte address decoder circuit 2*a* and the even number byte address decoder circuit 2*b* by switching for every byte in the N-bit operation. Thus, with respect to the address signal 4 and the address decoder signals 6 to 9, an address signal is formed in which the least significant bit is the address decoder signal 9, the address signal 4 are coupled thereto from the lower bits to the upper bits, then the address decoder signals 6, 7 and 8 are coupled thereto, and lastly the address decoder signal 8 is coupled thereto as the most significant bit. It should be noted that the two address decoder circuits 2*a* and 2*b* are operated in parallel in the 2N-bit operation.

FIG. 12 is a circuit diagram of the address bus buffer circuit 1 shown in FIG. 11. A reference numeral 4*a* denotes an address input line of the address input bus 4; 13*a* an address output line of the address output bus 13; 100 a buffer connected to the address input line 4*a*; 101 an inverter connected to the reset signal line 5; 102 an AND gate inputting the first and second chip select enable signals 10 and 11; 103 an OR gate connected to the output of the inverter 101 and the output of the AND gate 102 on the input side; and 104 an OR gate inputting the output the OR gate 103 and the output of the buffer 100. The circuit diagram shows only the construction for the one address input line 4*a*. The buffer 100 and the OR gate 104 are provided for each address input line 4*a* and the inverter 101, the AND gate 102 and the OR gate 103 are provided commonly for the address input lines 4*a*.

FIG. 13 is the operation mode table showing the operation of the even number byte address decoder circuit 2*a* and odd number byte address decoder circuit 2*b* shown in FIG. 11.

FIG. 14 is the circuit diagram of the write signal control circuit 3 shown in FIG. 11. A reference numeral 300 a buffer connected to the write enable signal input line 12; 301 an inverter connected to the reset signal line 5; 302 an AND gate to which the first and second chip select enable signals 10 and 11 are inputted; 303 an OR gate to which the output of the AND gate 302, the output of the inverter 301 and the write protect input signal 16 are inputted; 304 an OR gate to which the outputs of the OR gate 303 and the buffer are inputted; and 305 a buffer connected to the write protect signal output line 17.

Next, the operation will be described below. In this case the circuit is of negative logic.

The address bus buffer circuit 1 shown in FIG. 1 is a buffer circuit for the address input bus 4 and acts to achieve the baffer circuit and in addition controls the address input signal 4 to gate in accordance with the first and second chip select enable signals 10 and 11 and the reset signal 5.

As should be seen from FIG. 12, the address output signal 13*a* is set to the H level regardless of the address input signal 4*a* when the state in which the operation of the circuit is stopped, i.e., when there is established either one of the state in which the first and second chip select enable signal 10 and 11 are both in the H level, and the state in which the reset signal 5 is in the L level. This is because the address output bus 13 cannot be functioned when the operation of the controller is stopped. On the operation of the controller, i.e., when the reset signal 5 is in the H level, and when at least one of the first and second chip select enable signals 10 and 11 is in the L level, the address input signal 4*a* is supplied as the address output signal 13*a*.

Next, the even number byte address decoder circuit 2*a* and the odd number byte address decoder circuit 2*b* select one semiconductor memory or two semiconductor memories at a time in accordance with the reset signal 5, the address decoder input signals 6 to 9, the first and second chip select enable signals 10 and 11 and operate in accordance with the operation table shown in FIG. 13. As seen from FIG. 13, in the same manner as in the address buffer circuit 1, all signals on the decoder output line group 14*a* and 14*b*, each of which includes 8 output lines) are set in the H level when there is established either one of the state in which both the first and second chip select enable signals 10 and 11 are set in the H level and the state in which the reset signal 5 is set in the L level.

When the reset signal 5 is set in the H level, the controller is in the operation state and when the first enable signal 10 is set in the L level and the second enable signal 11 is set in the H level, the N-bit operation is performed. In this N-bit operation, when the address decoder signal 9 as the even number byte or the odd number byte select signal is set to the L level, one of the decoder output line group 14*a* of the even number byte address decoder circuit 2*a* is set the L level and when the address decoder signal 9 is set in the H level, one of the decoder output line group 14*b* of the odd number byte address decoder circuit 2*b* is set in the L level. In this manner, the semiconductor memory connected to the decoder output line of the L level is selected. Which signal line of the decoder output line groups 14*a* and 14*b* of the decoder circuits 2*a* and 2*b* is selected is determined based on 3 bits of the address decoder signals 6 to 8.

On the other hand, the 2N-bit operation is performed when the reset signal 5 is set in the H level and when both the first and second enable signal 10 and 11 are set in the L level. In this 2N-bit operation, one of each of the decoder output line groups 14*a* and 14*b* of the decoder circuits 2*a* and 2*b* is set in the L level in accordance with the address decoder signals 6 to 8 so that two semiconductor memories are selected at a time.

The write signal control circuit 3 is a circuit for controlling the write operation of data into a semiconductor memory by connecting the write enable output signal 15 to the write enable terminal of the semiconductor memory. As shown in FIG. 14, in the write signal control circuit 3, the write enable output signal 15 is set in the H level regardless of the write enable input signal 12 when the write protect input signal 16 is set in the H level in addition to when the controller is in the operation stopping state in which the first and second enable signals 10 and 11 are both set in the H level or the reset signal 5 is set in the L level as described above. The write enable output signal 15 is supplied in accordance with the write enable input signal 12 when at least one of the first and second enable signals 10 and 11 is set in the L level, the reset signal 5 is set in the H level, and the write protect input signal 16 is set in the L level, It should be noted that the write protect input signal 16 is always outputted as it is as the write protect output signal 17 regardless of the set level of another signal.

The conventional semiconductor memory controller is constructed as described above and has the following problems.

(1) First, in the conventional controller, the problem is caused in which if the circuits are constructed to have the CMOS structure, a "pass through" current flows in these circuit so that the power consumption increases unnecessarily when the signals of the input lines (including the bus) denoted with the reference numerals 4 to 12 and 16 in FIG. 11 change into an intermediate level between the L level and the H level.

(2) Next, in the convention controller, because the address bus buffer circuit 1 is designed to hold all the output signals 13 in the H level when the controller is not in the operation state (in the backup state), current is unnecessarily supplied in the operation stopping state in a case where there is connected an non-volatile semiconductor memory such as ROM which does not need the power supply. Therefore, there is caused another problem that the power is consumed unnecessarily when various types of semiconductor memories such as ROM and RAM different in signal levels to be supplied from each other are mixedly connected. In addition, in a case where the signal is fixed to the H level in the backup state, the problem on the change of signal level is cased so that the pass through current problem is also caused.

(3) Next, in the conventional controller, there is caused another problem that although the even number and odd number byte address decoder circuits 2*a* and 2*b* can individually control the N-bit operation semiconductor memory and the 2N-bit operation semiconductor memories such that they can be switched, the circuits 2*a* and 2*b* cannot control the semiconductor memories in the state in which the N-bit operation state and the 2N-bit operation state are mixedly present.

(4) Further, in the conventional controller, there is caused still another problem that because all the address space (memory space) is divided in units of a predetermined area unit in accordance with the address decoder output signal groups 14*a* and 14*b* of the even number and odd number byte address decoder circuits 2*a* and 2*b*, the divided area cannot be divided into the further small areas.

(5) Furthermore, in the conventional controller, the signals such as the output signals 14*a* and 14*b* of the address decoder circuits 2*a* and 2*b* and the write enable output signal 15 of the write signal control circuit 3 are all set in the H level forcedly when the controller is in the operation stopping state (in the backup state) because the controller is of a negative logic circuit). However, the above output signals is preferably set in the L level (GND level) because the power is not consumed unnecessarily in a case of the non-volatile semiconductor memory such as ROM which does not require the power supply in the backup state. Thus, there is caused in the conventional controller further another problem that the signal levels of the output signals of the address decoder circuits 2*a* and 2*b* and the write signal control circuit 3 cannot changed based on the type of the semiconductor memory connected thereto.

SUMMARY OF THE INVENTION

The present invention is made to solve the above problems and has, as an object, to provide a semiconductor memory controller in which (1) a pass through current does not flow even if a signal on an input line is changed, (2) the power consumption can be decreased in the backup state, (3) an N-bit semiconductor memory and an 2N-bit semiconductor memory can be mixedly controlled, (4) a predetermined unit address area can be further divided, and (5) the signal level of an output signal from a circuit in the backup state can be changed in accordance with the type of semiconductor memory connected thereto.

In the light of the above object, the present invention provides a semiconductor memory controller for controlling the operation of a plurality of semiconductor memories in accordance with input signals from the external, including:

address bus buffer means for supplying an address signal to each of the plurality of semiconductor memories in accordance with the input signal from the external;

address decode means for selectively setting each of the plurality of semiconductor memories in an active state in accordance with the input signal from the external;

write signal control means for controlling a write operation to the semiconductor memories in accordance with the input signal from the external; and pass through current preventing input buffer means composed of gates of a CMOS structure having a plurality of inputs, having a structure in which a pass through current does not flow even if the signal level of the input signal is changed, and provided on the input side of the above means, for the input signals from the external.

The present invention provides a semiconductor memory controller further includes operation state detecting means composed of gates of the CMOS structure having a plurality of inputs similar to the above pass through current preventing input buffer means, for determining based on the input signal from the external whether or not the controller is to be set in the operation state, and for setting all the outputs of the pass through current preventing input buffer means and the address bus buffer means in a GND level when the controller is determined to be set in the operation stopping state.

The present invention provides a semiconductor memory controller for controlling the operation of a plurality of semiconductor memories in accordance with input signals from the external, including:

address bus buffer means for supplying an address signal to each of the plurality of semiconductor memories in accordance with the input signal from the external;

N-bit address decoder means for selectively setting the N-bit semiconductor memory in an active state in accordance with the input signal from the external;

2N-bit address decoder means for selectively setting the 2N-bit semiconductor memory in an active state in accordance with the input signal from the external such that an address space continuous for the 2N-bit semiconductor memory with that for the N-bit semiconductor memory is formed; and write signal control means for controlling a write operation to the semiconductor memories in accordance with the input signal from the external, whereby the semiconductor memory controller can control the N-bit semiconductor memory and the 2N-bit semiconductor memory which are mixedly present.

The present invention provides a semiconductor memory controller for controlling the operation of a plurality of semiconductor memories in accordance with input signals from the external, including:

address bus buffer means for supplying an address signal to the plurality of semiconductor memories in accordance with the input signal from the external;

address decoder means for selectively setting each of the plurality of semiconductor memories in an active state in accordance with the input signal from the external;

subaddress decoder means for selectively setting another semiconductor memory having a capacity smaller than that of the semiconductor memory in an active state in accordance with one of the outputs of the address decoder means and the address signal such that an address space continuous with that for the semiconductor memory is formed; and write signal control means for controlling a write operation to the semiconductor memories in accordance with the input signal from the external, whereby the semiconductor memory controller can control the semiconductor memories which have different capacities from each other by dividing and assigning the address area assigned to the semiconductor memory set in the active state by the address decoder means into the plurality of semiconductor memories having the small capacities.

The present invention provides a semiconductor memory controller for controlling the operation of a plurality of semiconductor memories in accordance with input signals from the external, including:

address bus buffer means for supplying an address signal to the plurality of semiconductor memories in accordance with the input signal from the external;

address decoder means for selectively setting each of the plurality of semiconductor memories in an active state in accordance with the input signal from the external;

write signal control means for controlling a write operation to the semiconductor memories in accordance with the input signal from the external;

backup state control means for outputting a control signal for changing output levels of the address decoder means and the write signal control means in accordance with a select signal transmitted from the external when the controller changes into the backup state;

three state output buffer means for outputting the outputs from the address decoder means and the write signal control means in the state as they are or in the high impedance state in which all the outputs are forcedly set; and signal level fixing means for fixing each of the outputs in the H level or L level when the outputs from the three state output buffer means are set in the high impedance state, whereby the semiconductor memory controller can switch the signal levels of the outputs of the three state output buffer means in the operation stopping state of the controller in accordance with the types of the semiconductor memories to be controlled.

The present invention provides a semiconductor in which the backup state control means further includes a delay circuit for delaying and outputting the control signal for the select signal, and the control signal is supplied after the outputs of the three state output buffer means are completely changed into the output levels of the address decoder means and the write signal control means when the controller changes into the operation stopping state.

The present invention provides a semiconductor memory controller including all the aspects 1 to 6 of the present invention.

In the present invention, the input buffer means is composed of gates of the CMOS structure having the plurality of inputs for the input signals from the external so that there is achieved the structure in which the pass through current does not flow even if the signal levels of the input signals change.

In the present invention, there is further provided the operation state detecting means composed of gates of the CMOS structure having a plurality of inputs similar to the above pass through current preventing input buffer means, for determining based on the input signal from the external whether or not the controller is to be set in the operation state, and for setting all the outputs of the pass through current preventing input buffer means and the address bus buffer means in a GND level when the controller is determined to be set in the operation stopping state, so that the signal level change and the pass through current can be prevented in the following state. It should be noted that the operation state detecting means is formed with the CMOS gate structure having a plurality of inputs similar to the above-mentioned pass through current preventing input buffer means.

In the present invention, the N-bit address decoder means and the 2N-bit address decoder means are provided in parallel and the N-bit semiconductor memory and the 2N-bit semiconductor memory are mixedly provided such that a continuous address space can be formed and can be controlled.

In the present invention, the address decoder means for a semiconductor memory having a great capacity and the subaddress decoder means for the semiconductor memory having a less capacity than that of the above semiconductor memory are provided in parallel and the semiconductor memories having different capacities are mixedly provided such that a continuous address space can be formed, and can be controlled.

In the present invention, there are provided the backup state control means for outputting a control signal for changing output levels of the address decoder means and the write signal control means in accordance with a select signal transmitted from the external when the controller changes into the backup state, the three state output buffer means for outputting the outputs from the address decoder means and the write signal control means in the state as they are or in the high impedance state in which all the outputs are forcedly set, and the signal level fixing means for fixing each of the outputs in the H level or L level when the outputs from the three state output buffer means are set in the high impedance state, whereby the semiconductor memory controller can switch the signal levels of the outputs of the three state output buffer means in the operation stopping state of the controller in accordance with the type of the semiconductor memory to be controlled.

In the present invention, there is further provided the delay circuit for delaying and outputting the control signal for the select signal from the external to the backup state control means, and the control signal is supplied after the outputs of the three state output buffer means are completely changed into the output levels of the address decoder means and the write signal control means when the controller changes into the operation stopping state, resulting in eliminating erroneous operation of the signals.

In the present invention there is provided a semiconductor memory controller including all the aspects 1 to 6 of the present invention.

BRIEF DESCRIPTION OF THE DRAWINGS

FIG. 1 is a circuitry block diagram showing a semiconductor memory controller according to an embodiment of the present invention which controller contains all the aspects of the present invention;

FIG. 4 shows an operation table of each of decoders in the controller of the present invention;

FIG. 6 shows an operation table of each of address decoders in another mode in the controller of the present invention;

FIG. 7 shows an operation table of each address decoder in further another mode in the present invention;

FIG. 8 shows an operation table of a subaddress decoder circuit in the controller of the present invention;

FIG. 9 is a circuit diagram showing the connection between a three state output buffer circuit and a backup state control circuit shown in FIG. 1;

FIGS. 10A, 10B, 10C, 10D are timing charts of each of elements of the backup state control circuit shown in FIG. 9;

FIG. 13 shows an operation table of an address decoder circuit shown in FIG. 11.

DESCRIPTION OF THE PREFERRED EMBODIMENTS

Figure 2:
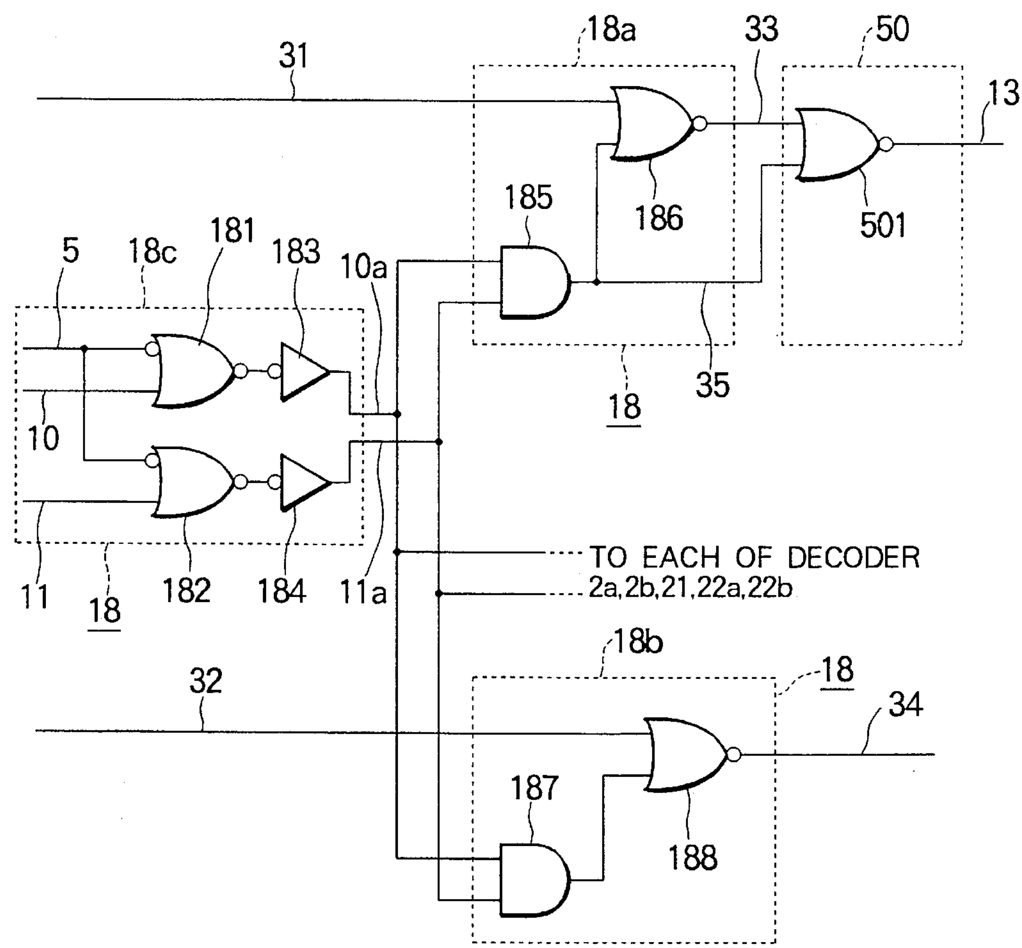
FIG. 2 is a circuit diagram showing connection between the address bus buffer circuit and the pass through current preventing input buffer circuit shown in FIG. 1.

FIG. 1 shows a circuitry block diagram of an embodiment of a semiconductor memory controller according to the invention. In the figure, the same components as those in the conventional semiconductor memory controller or components equivalent to those in the conventional semiconductor memory controller are denoted with the same reference numerals.

In FIG. 1, a reference numeral 18 denotes a "pass through current preventing" input buffer circuit which includes a first input buffer circuit 18*a* and a second input buffer circuit 18*b*, which are separated into upper and lower portions of the figure to be shown, and an operation state detecting circuit 18*c*. A reference numeral 19 denotes a three state output buffer circuit, 20 a backup state control circuit, 21 2N-bit select address decoder circuit, and 22*a* and 22*b* subdecoder circuits. A subdecoder enable signal input line 25 and a high impedance select signal input line 40 are added as input lines.

FIG. 2 is a circuit diagram showing the connection of an address bus buffer circuit 50 and the pass through current preventing input buffer circuit 18 shown in FIG. 1. The operation state detecting circuit 18*c* includes OR gates 181 and 182 into which an input signal is inverted and inputted, and inverters 183 and 184. The OR gate 181 has an inverted signal of a reset signal 5 and a first chip select enable signal 10 as input signals and the output thereof is connected to the inverter 183. On the other hand, the OR gate 182 has the inverted signal of the reset signal 5 and a second chip select enable signal 11 as input signals and the output thereof is connected to the inverter 184. The outputs of the inverters 183 and 184 are supplied to the first and second input buffer circuit 18*a* and 18*b* and decoder circuits 2*a*, 2*b*, 21, 22*a*, and 22*b* (see FIG. 1) as first and second internal chip select enable signal 10*a* and 11*a*, respectively.

The first input buffer circuit 18*a* is a buffer circuit for the address decoder input signal lines 6 to 9 for designating a semiconductor memories for which the read or write operation of data is performed, and an address input signal 4 for designating a specific address in the semiconductor memory. The second input buffer circuit 18*b* is a buffer circuit for control signals such as a subdecode enable input signal 25, a write enable input signal 12 and a write protect input signal 16.

In FIG. 2, an input signal line 31 shows an either one of the signal lines denoted by the reference numerals 4 and 6 to 9 (each of signal lines in a case of a bus) and an input signal line 32 shows an either one of signal lines denoted by the reference numerals 12, 16 and 25. In the first input buffer circuit 18*a*, an AND gate 185 is provided commonly to the signal lines and a NOR gate 186 is provided for each of the signal lines 31. The AND gate 185 inputs the first and second internal chip select enable signal 10*a* and 11*a*, and the NOR gate 186 inputs the input signal 31 and the output of the AND gate 185. Further the output of these gates 185 and 186 are connected to the input terminals of a NOR gate 501 of the address bus buffer circuit 50. In the second input buffer circuit 18*b*, an AND gate 187 is provided commonly to the signal lines and a NOR gate 188 is provided for each of the signal lines 32. The AND gate 187 inputs the first and second internal chip select enable signal 10*a* and 11*a*, and the NOR gate 188 inputs the input signal 32 and the output of the AND gate 187. The output of the NOR gate 188 is supplied to the write signal control circuit 3 (see FIG. 1). The pass through current preventing input buffer circuit 18 is divided into three circuits 18*a* to 18*c* which are shown. However, needless of saying, the circuit 18 may be made unitary.

The operation state detecting circuit 18*c* for detecting whether the controller is in the operation state or in the operation stopping state outputs the first and second internal enable signals 10*a* and 11*a* in the operation stopping state, i.e., when there is established the either state in which the reset signal 5 is set in the L level or the state in which the first and second enable signals 10 and 11 are both set in the H level. Thereby the first and second buffer circuits 18*a* and 18*b* has the output signals 33 and 34 all set in the L level regardless of the input signals 31 and 32 of the L level or H level. Therefore, the signal level does not change, compared to the case of fixing the signal level to the H level like the conventional method, resulting in decreasing the unnecessary current flow. It should be noted that the first and second enable signals 10 and 11 are supplied as the first and second internal chip select enable signals 10*a* and 11*a* as they are, respectively, when the first and second enable signals 10 and 11 and the reset signal 5 are set in states other than the above-mentioned states (in the operation state of the controller).

Figure 3:
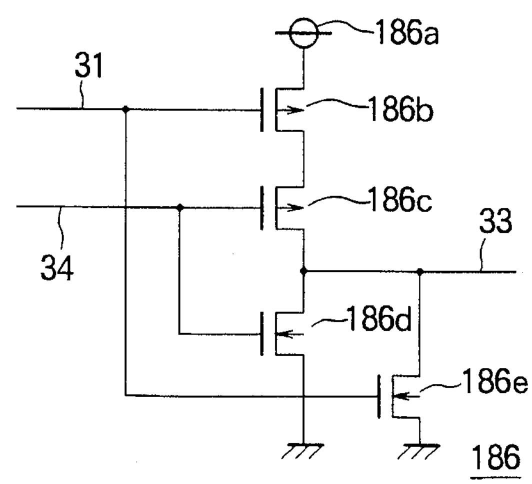
FIG. 3 is a circuit diagram showing the structure of a NOR gate shown in FIG. 2.

The NOR gates 181, 182, 186 and 188 which directly receive the input signals from the external denoted with the reference numerals 5, 10, 11, 31 and 32 in FIG. 2 are all composed of CMOS gates shown in FIG. 3. The NOR gate 186 is shown in FIG. 3 as an example. A reference numeral 186*a* denotes a power supply; 186*b* and 186*c* p channel MOS transistors, respectively; 186*d* and 186*e* n channel MOS transistors, respectively. By constituting the NOR gate with the CMOS gates having a plurality of inputs, the pass through current which is peculiar to the CMOS gate does not flow even if the input signal 31 is set in an intermediate level (a potential level between the H level and the L level) when the signal 33 as the gate control signal is set in the H level, resulting in decreasing the power consumption.

In addition, as shown in FIG. 2, in the address bus buffer circuit 50, because the NOR gate 501 is controlled based on the signal 35 as in the first input buffer circuit 18*a*, all the signals of the address output bus 13 are set in the L level in the operation stopping state of the controller, i.e., when the reset signal 5 is set in the L level or when both the first and second enable signals 10 and 11 are set in the H level. Thereby, address signals of the L level are supplied to each semiconductor memory with no relation of ROM or RAM in the operation stopping state so that the unnecessary power consumption can be suppressed.

The relation of the conventional first and second enable signals 10 and 11 and the operation of the controller will be described. Suppose that the controller is in the operation stopping state as described above, when the first and second enable signals 10 11 are both set in the H level, as shown in FIG. 13. In a case that the first enable signal 10 is set in the L level and the second enable signal 11 is set in the H level, the even number byte address decoder circuit 2*a* becomes active when the least significant bit decoder input signal 9 is set in the L level, and the odd number byte address decoder circuit 2*b* becomes active when the decoder input signal 9 is set in the H level. That is, the even number byte address decoder circuit 2*a* and the odd number byte address decoder circuit 2*b* become active alternatively. When the first enable signal 10 is set in the H level and the second enable signal 11 is in the L level, only the odd number byte address decoder circuit 2*b* becomes active with no relation to the value of the least significant bit decoder input signal 9, i.e., only the odd number byte address decoder circuit 2*b* can be used. Further, when the first and second enable signal 10 and 11 are both in the L level, the two decoder circuit 2*a* and 2*b* both become active to perform a 2N-bit operation. In this manner, in the conventional controller, the semiconductor memory must be selected to be of the N-bit memory or the 2N-bit memory.

On the other hand, in the present invention, the controller is provided with the 2N-bit select address decoder circuit 21 to which a 2N-bit semiconductor memory (not shown) can be connected, in addition to the even number byte address decoder circuit 2*a* and the odd number byte address decoder circuit 2*b*, as shown in FIG. 1, so that the control can be performed even in the state in which there are the N-bit semiconductor memories and the 2N-bit semiconductor memories.

FIG. 4 is the operation table of the controller showing the operation of the even number and odd number type address decoder circuits 2*a* and 2*b* and the 2N-bit select address decoder circuit 21 in a mode when the first enable signal ($\overline{CSE1}$) 10 in the L level and the second enable signal ($\overline{CSE2}$) is in the H level. In FIG. 4 the MCSA0 to MCSA7 indicate the 8 signal lines (output signals) of the decoder output line group 14*a* of the even number byte address decoder circuit 2*a*, MCSB0 to MCSB7 the 8 signal lines (output signals) of the decoder output line group 14*b* of the odd number byte address decoder circuit 2*b*, and MCSW0 to MCSW7 the 8 signal lines (output signals) of the decoder output line group 23 of the 2N-bit select address decoder circuit 21.

Figure 5:
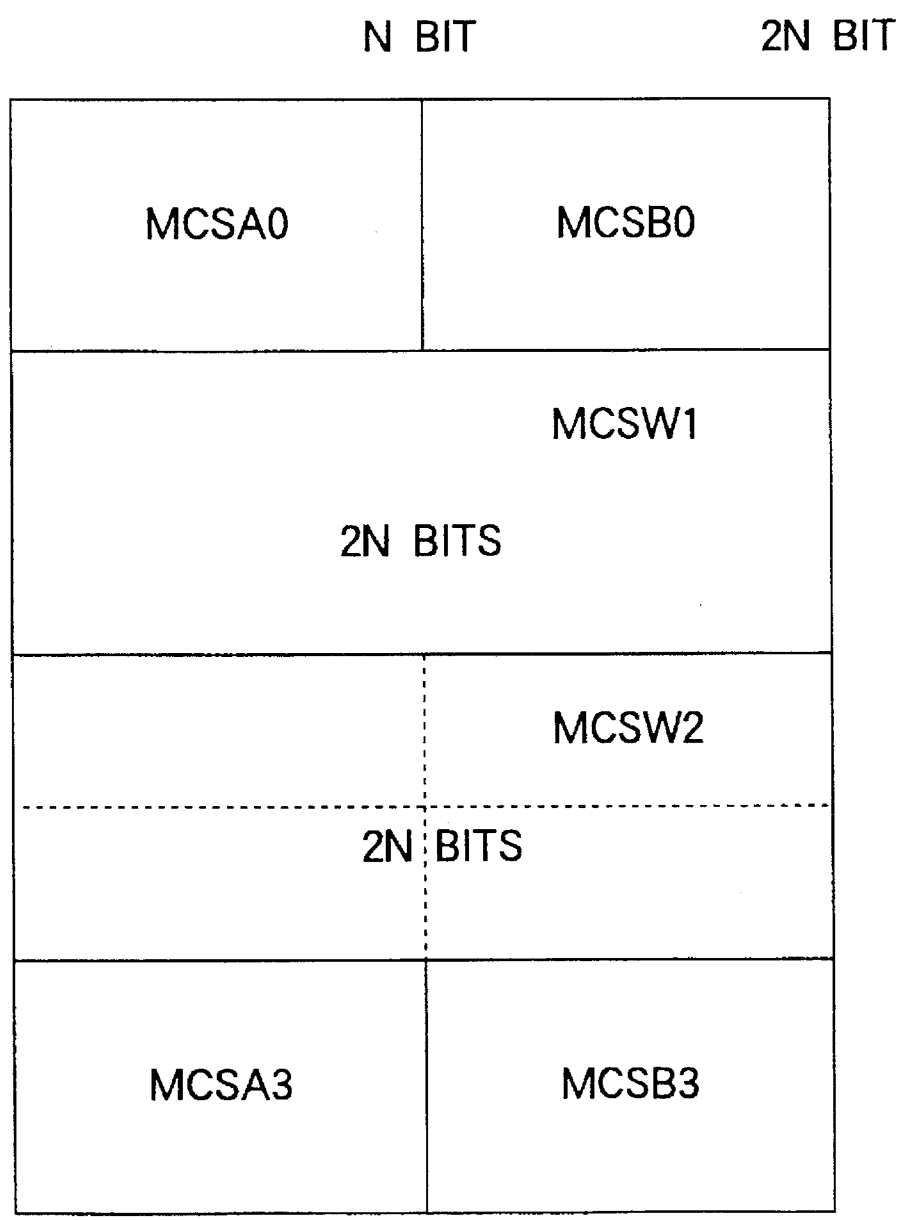
FIG. 5 shows an example of memory map in the controller of the present invention.
Figure 11:
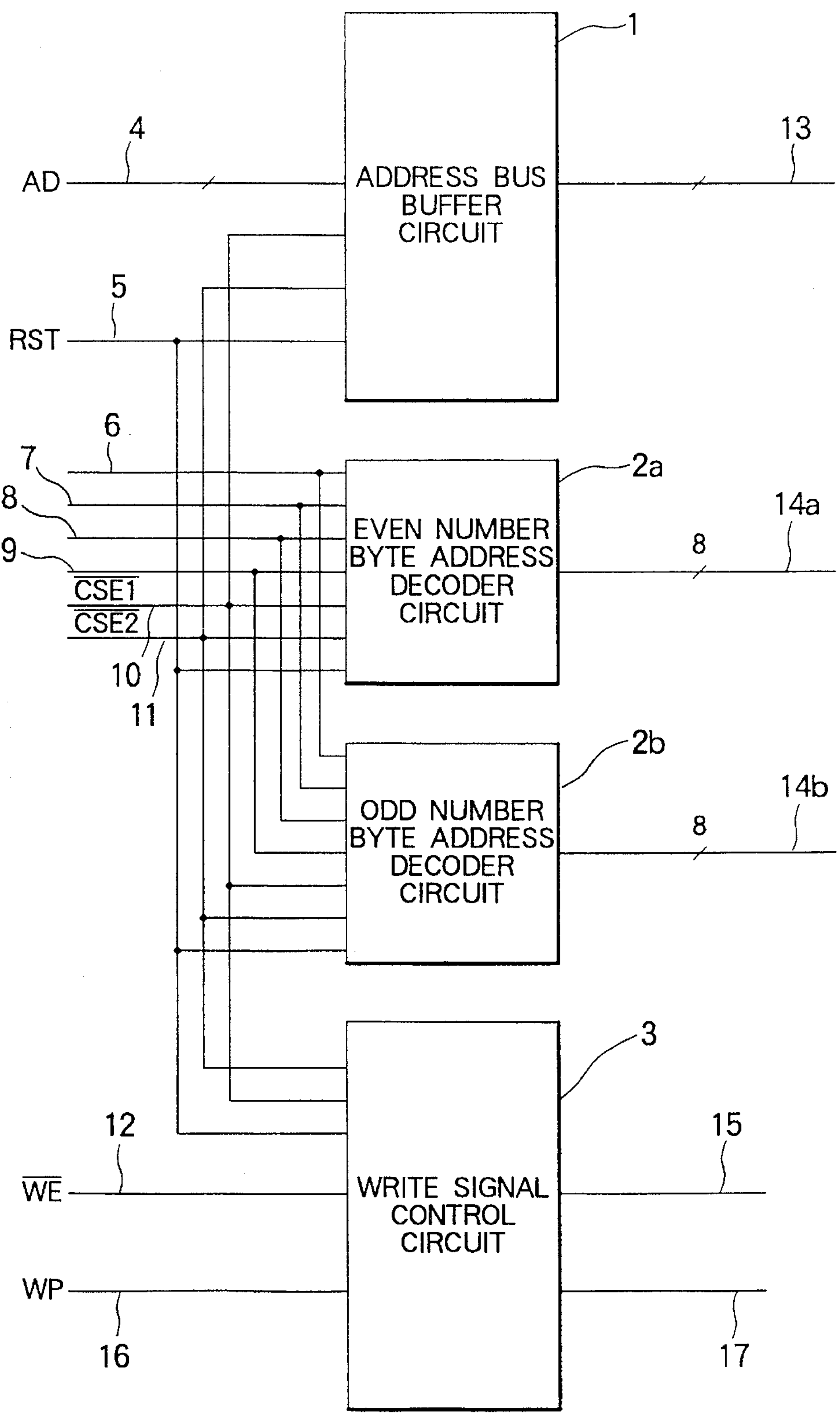
FIG. 11 is a circuitry block diagram showing a conventional semiconductor memory controller.
Figure 12:
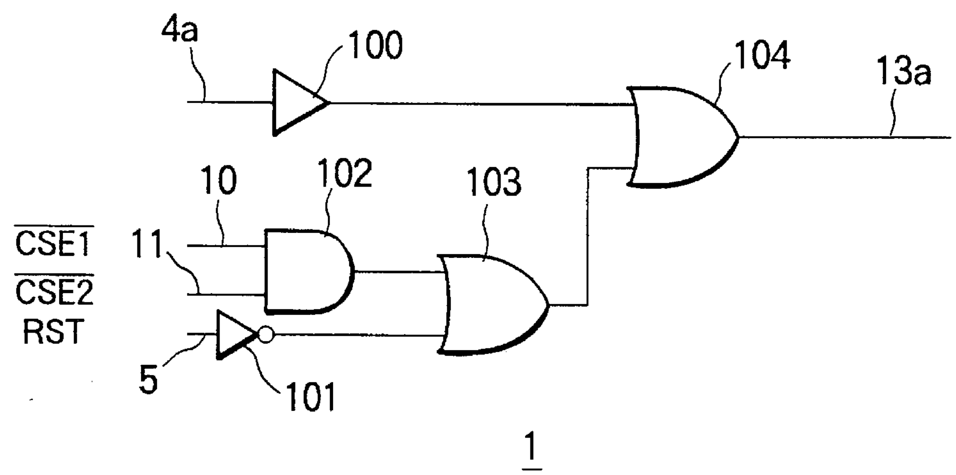
FIG. 12 is a circuit diagram showing an address bus buffer circuit shown in FIG. 11.
Figure 14:
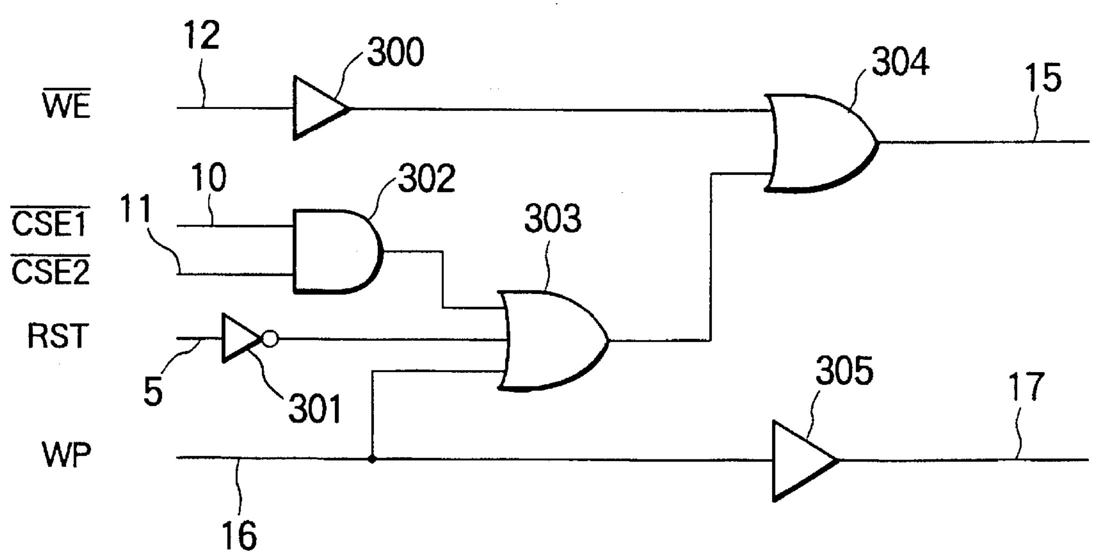
FIG. 14 is a circuitry diagram of a write signal control circuit shown in FIG. 11.

FIG. 5 shows an example of the memory map when both the N-bit semiconductor memories and the 2N-bit semiconductor memories are present. In FIG. 5 the even number and odd number byte address decoder circuit 2*a* and 2*b* becomes active alternatively in the first segment which is an area for the N-bit semiconductor memory connected to these circuits. In the next two segments the 2N-bit select address decoder circuit 21 becomes active and these segments are for the 2N-bit semiconductor memory connected to the decoder circuit 21. In the last segment the same operation is performed as in the first segment and the last segment is for the N-bit semiconductor memory connected to the even number and odd number byte address decoder circuits 2*a* and 2*b*. In this manner, the control can be performed even in the state in which the N-bit semiconductor memory (semiconductor memory having a data bus of N-bit width) and the 2N-bit semiconductor memory are both present. It should be noted that FIGS. 6 and 7 show the operation tables when the first enable signal ($\overline{CSE1}$) 10 is in the H level and the second enable signal ($\overline{CSE2}$) 11 is in the L level and when the first and second enable signals 10 and 11 are both in the L level, respectively. Even in these cases, in the controller of the present invention, the control can be performed in the state in which the N-bit semiconductor memory and the 2N-bit semiconductor memory are both present.

When the even number and odd number byte subaddress decoder circuit 22*a* and 22*b* shown in FIG. 1 are further provided, it is possible to divide a segment of a memory map (a portion of address space) into a plurality of subsegments, as shown by broken lines in FIG. 5, for example. Thereby, the control can be performed without an empty space even in the state in which semiconductor memories having different memory capacities are present. That is, in the present invention, by connecting an output pin (not shown) or an output line of the 2N-bit select address decoder circuit 21 to the subdecoder enable signal input line 25 (see FIG. 1), the address space corresponding to the output pin of the 2N-bit decoder circuit 21 can be divided so that an address can be decoded. The subaddress decoder circuits 22*a* and 22*b* are connected on the input sides with the subdecoder enable signal output line 26 from the second input buffer circuit 18*b,* the first and second internal enable signal lines 10*a* and 11*a,* the decoder signal input line 9 as the least significant bit, and a branched address bus 27 obtained by branching a part of the address input bus 4. In this embodiment, because each of the subdecoder circuits 22*a* and 22*b* has 4 output lines, the branched address bus 27 is a 2 -bit width.

FIG. 8 shows the operation table of the even number and odd number byte subaddress decoder circuit 22*a* and 22*b*. The relation of the decoder circuits 22*a* and 22*b* is basically the same as that of the above-mentioned even number and odd number byte address decoder circuits 2*a* and 2*b* and hence the detailed description will be omitted.

Consider that the address space is constituted as shown in FIG. 5, for instance. In this case, the output lines MCSA0, MCSA3, MCSB0 and MCSB3 of the output line groups 14*a* and 14*b* of the even number and odd number byte address decoder circuits 2*a* and 2*b* are connected to the N-bit semiconductor memories (having a N-bit data bus) of 2 Mega bits, respectively, and the output line MCSW1 of the output line group 23 of the 2N-bit decoder circuit 21 is connected to the 2N-bit semiconductor memory (having a 2N-bit data bus) of 4 Mega bits. The subdecoder enable signal input line 25 is connected to the output line (output pin) MCSW2 of the 2N-bit decoder circuit 21 and N-bit semiconductor memories of 1 Mega bits are connected to the output lines 28*a* and 28*b* of the subaddress decoder circuit 22*a* and 22*b*. In such a construction, if a decoder input is selected properly, a continuous memory space without any empty space can be obtained as shown in FIG. 5. FIG. 9 shows a block diagram of the backup control circuit 20 and the three state output buffer circuit 19 relating to these inventions. It is made possible to change the signal levels on the output lines of each address decoder circuit and the write signal control circuit upon backing up in accordance with the type of the semiconductor memory connected thereto. Further, it is possible to surely change the signal level on the output line with no operation error in switching the signal level on the output line of each of the above-mention circuits.

In the backup control circuit 20 of FIG. 9, a reference numeral 201 denotes an AND gate for inputting a high impedance select signal 40 from the external and the inverted signal of the reset signal 5, 202 a delay circuit for delaying the output of the AND gate 201, 203 an AND gate for inputting the outputs of the AND gate 201 and the delay circuit 202. In the three state output buffer circuit 19, a reference numeral 191 denotes a three state buffer which is provided for each of the output lines denoted by the reference numerals 14*a*, 14*b*, 23, 28*a*, 28*b,* 15 and 17 in FIG. 1. An output line 36 is indicated as the representative of these output lines and an output line 37 is indicated as the representative of the output lines of the three state buffer 191. The three state buffer 191 on the upper side of the figure is for a case that the semiconductor memory connected to the output line 37 is a volatile type of semiconductor memory such as RAM requiring to back up and the three state buffer 191 on the lower side of the figure is for a case that the semiconductor memory is a non-volatile type of semiconductor memory such as ROM that does not require back up. The three state buffer 191 outputs an input signal as it is when a control signal 192 to the control terminal is in the L level and the output is set in the high impedance state (Hz) regardless of the input signal level when the control signal is in the H level. In a case where the volatile memory as shown on the upper side of FIG. 9 is connected, in order to raise the signal level to the H level when the output line 37 of the three state buffer 191 is set in the high impedance state ("Hz"), the output line 37 is connected to a power supply (A power supply) 197 which is backed up, via a pull-up resistor 195. In a case where the non-volatile memory as shown on the lower side of the figure is connected, the output line 37 of the three state buffer 191 is connected via a pull-up resistor 196 to a power supply (B power supply) 198 which is not backed up so that the signal level can be fallen down when the output line 37 is set in the high impedance state ("Hz"). It should be noted that the power supply backed up is a type of power supply which supplies power in the operation stopping state, e.g., a power supply line is connected to the built-in battery (not shown) for data backup and the power supply not backed up is a type of power supply which does not supply power in the operation stopping state, e.g., the power supply line is connected to an external power supply.

When the three state buffer 191 is provided for each of the output lines 36 (see FIG. 9) of the address decoder circuits 2*a*, 2*b*, 21, 22*a* and 22*b* and the write signal control circuit 3 shown in FIG. 1, the controller is designed such that the state of the output signal 37 of the three state buffer 191 upon backup can be controlled based on the high impedance select signal 40 externally. Therefore, the delay circuit 202 and the AND gate 203 of the control circuit 20 is not necessarily required and the structure needs to be employed at least in which the output of the AND gate 201 of the control circuit 20 is directly supplied to the control terminal of each three state buffer 191. The semiconductor memory composed of negative logic circuits usually go to the active state (enable state) when the control signals (output 37) supplied from the decoder circuits and the write signal control circuit is in the L level and go to the non-active state (disable state) when they are in the H level. Therefore, the decoder circuits and the write signal control circuits set all the outputs to the H level upon the backup. If all the semiconductor memories to be controlled in this controller are volatile memories which require the backup, the high impedance select signal 40 is set to the L level. Thus, because a signal of the L level is supplied to the control terminal of the three state buffer 191 with no relation to the level of the reset signal 5, if a signal of the H level is supplied as the signal 36 upon the backup, the output signal 37 of the H level is supplied to each memory as it is.

In a case where there are mixedly volatile memories and non-volatile memories not required to back up, the high impedance select signal 40 is set in the H level for the control. Thereby, when the reset signal 5 changes from the H level to the L level upon the backup, the control terminal of each three state buffer 191 is supplied with the control signal 192 of the H level so that the outputs 37 are all in the high impedance state ("Hz"). As a result, the output line 37 to which the volatile semiconductor memory is connected is coupled to the A power supply 197 which backs up via the pull-up resistor 195 as shown on the upper side of FIG. 9 so that the signal level is raised to the H level. On the contrary, as shown on the lower side of the figure, the output line 37 to which the non-volatile semiconductor memory is connected is coupled to the B power supply 198 which does not back up, via the pull-up resistor 196 so that signal level is fallen down to the L level. Thus, the volatile memory is supplied with the control signal of the H level to set in the active state while the non-volatile memory not required to back up is supplied with the control signal of the L level, resulting in prevention of the unnecessary power consumption. Because the non-volatile memory is not supplied with the power upon the backup, there is no problem even if the control signals supplied from the decoder circuit and the write signal control circuit is in the L level.

In a case where all the semiconductor memories to be controlled by the controller are non-volatile memories not required to back up, the high impedance select signal 40 is set in the H level and all the output lines 37 are connected to the B power supply which does not back up via the pull-up resistor 196.

The control circuit 20 is constructed as shown in FIG. 9. In this case, when the select signal 40 is set in the H level to set the outputs 37 of the three state buffer 191 in the high impedance state, the timing when the control signal of the H level is supplied to the control terminal of the three state buffer 191 is delayed, compared to the timing when the reset signal 5 changes from the H level to the L level upon the backup.

This will be described more in detail. FIGS. 10A to 10D are timing charts when each of the elements of the output buffer circuit 19 and the control circuit 20 shown in FIG. 9 is switched from the operations state to the backup state. Assume that the output 36 from the decoder circuit or the write signal control circuit 3 is in the L level. The backup state is set at the time T1 of these figures to change the reset signal 5 to the L level so that the output 36 changes from the L level to the H level and the output of the three state buffer 191 is also changed from the L level to the H level. For instance, assume that the control signal 192 of the H level is supplied to the control terminal of the buffer 191 at the time T1, i.e., at the same time when the backup state is set. There is a lapse of time before the output of the buffer 191 is set completely in the H level. In this case, therefore, there is a possibility that the high impedance state is set before the output of the buffer 191 is set completely in the H level so that the control signal of the H level is not supplied to the volatile semiconductor memory surely. Because the volatile semiconductor memory is required to be set in the non-active state upon the backup, the control signal of the H level should be given in advance. For this purpose, the delay time from the time T1 is presented by the delay circuit 202 and the AND gate 203 and the control signal 192 of the H level is supplied to the buffer 191 at the time T2 so that the output of the buffer 191 is set in the high impedance state. In this manner, the output of the buffer 191 can be set in the high impedance state after being set completely in the H level and the volatile semiconductor memory can be supplied surely with the control signal of H level in switching from the operation state to the operation stopping state (backup state). It should be noted that the output is thereafter fixed to the H level by the pull-up resistor.

Conventionally, if externally mounted resistors such as the pull-up resistors 195 and 196 are provided, there is a case that a signal of a predetermined level cannot be supplied surely to the semiconductor memory because it takes time to set the output signal in the H level with a resistor. In the present invention, after the control signal is set surely to the H level by the decoder circuit and the write signal control circuit of the controller, the high impedance state ("Hz") is set so that any erroneous operation can be prevented.

Although different embodiments are individually described in the above description, it is possible to construct the controller including all the features in an IC chip as shown in FIG. 1 and thereby a semiconductor memory controller can be obtained in which many functions are condensed and the control can be performed even if various types of semiconductor memories are present.

As described above, according to the present invention, because the input buffer means for receiving the input signals externally is composed of gates of the CMOS structure having the plurality of inputs, pass through current does not flow even if the signal level of an input signal changes to be in an intermediate level, resulting in reducing the power consumption.

According to the present invention, there is further provided the operation state detecting means composed of gates of the CMOS structure having a plurality of inputs similar to the above pass through current preventing input buffer means, for determining based on the input signals from the external whether or not the controller is to be set in the operation state, and for setting all the outputs of the pass through current preventing input buffer means and the address bus buffer means in a GND level when the controller is determined to be set in the operation stopping state, so that the change of the signal level of the outputs and the generation of the pass through current can be prevented in the following state. In addition, the address signal of the GND level (L level) is designed to be generated in the operation stopping state, so that unnecessary power consumption can be avoided and the effective control can be performed, even if RAM and ROM are mixedly present.

According to another aspect of the present invention, the N-bit address decoder means and the 2N-bit address decoder means are provided in parallel and can be controlled so as to form a continuous address space therefor, so that the control can be effectively performed even if the N-bit semiconductor memory and the 2N-bit semiconductor memory are mixedly provided.

According to yet another aspect of the present invention, the address decoder means for a semiconductor memory having a great capacity and the subaddress decoder means for a semiconductor memory having a less capacity than that of the above semiconductor memory are provided in parallel and such semiconductor memories having different capacities can be controlled such that a continuous address space can be formed, so that the control can be effectively performed even if these semiconductor memories are mixedly present.

According to still another aspect of the present invention, there are provided the backup state control means for outputting a control signal for changing the output levels of the address decoder means and the write signal control means in accordance with a select signal transmitted from the external when the controller changes into the backup state, the three state output buffer means for outputting the outputs from the address decoder means and the write signal control means in the state as they are or in the high impedance state in which all the outputs are forcedly set, and the signal level fixing means for fixing each of the outputs to the H level or L level when the outputs from the three state output buffer means are set in the high impedance state, so that the signal levels of the outputs of the three state output buffer means in the operation stopping state of the controller can be switched in accordance with the types of semiconductor memories to be controlled, resulting in reducing unnecessary power consumption.

According to the present invention, there is further provided the delay circuit for delaying and outputting the control signal for the select signal supplied from the external to the backup state control means, and the control signal is designed to be supplied after the outputs of the three state output buffer means are completely changed into the output levels of the address decoder means and the write signal control means when the controller changes into the operation stopping state, so that any erroneous operation can be avoided, resulting in increasing the reliability.

According to a further aspect of the present invention, all the previously described aspects of the invention are constructed in an IC chip collectively, so that many functions can be provided condensedly and the control can be effectively performed even if various types of semiconductor memories are mixedly present.

What is claimed is:

1. A semiconductor memory controller for controlling operation of a plurality of semiconductor memories in accordance with a plurality of external input signals comprising:

address bus buffer means for supplying an address signal to each of a plurality of semiconductor memories in accordance with a first signal;

address decoder means for selectively setting each of the semiconductor memories in an active state in response to a plurality of second signals;

write signal control means-for controlling storing of data in the semiconductor memories in response to a plurality of third signals; and pass through current preventing means connected to said address bus buffer means, said address decoder means and said write signal control means for generating the first signal and the plurality of second and third signals and for preventing the flow of pass through current from said address bus buffer means, said address decoder means and said write signal control means when any one of the plurality of external signal includes an intermediate state between a high level and a low level.

2. The semiconductor memory controller according to claim 1 comprising operation state detecting means including a second CMOS structure having a plurality of gates for determining, based on the external input signal, whether said controller is to be set in an operation state and for setting outputs of said pass through current preventing input buffer means and said address bus buffer means to a GND level when said controller is to be set in a stop state.

3. The semiconductor memory controller of claim 1 wherein said pass through current preventing means includes a first pass through current preventing input buffer circuit connected to said address bus buffer means and a second pass through current preventing input buffer circuit connected to said write signal control means.

4. The semiconductor memory controller of claim 3 wherein each of the first and second pass through current preventing input buffer circuits includes a plurality of logic gates.

5. The semiconductor memory controller of claim 4 wherein each of the plurality of logic gates includes a CMOS gate.

6. A semiconductor memory controller for controlling operation of a plurality of semiconductor memories in accordance with external input signals comprising:

address bus buffer means for supplying an address signal to each of a plurality of N-bit and 2N-bit semiconductor memories in accordance with an external input signal where N is an integer;

N-bit address decoder means for selectively setting each of the N-bit semiconductor memories in an active state in accordance with the external input signal;

2N-bit address decoder means for selectively setting each of the 2N-bit semiconductor memories in an active state in accordance with the external input signal;

write signal control means for controlling storing of data in the semiconductor memories in response to the external input signal whereby said semiconductor memory controller can control the N-bit semiconductor memories and the 2N-bit semiconductor memories.

7. A semiconductor memory controller for controlling operation of a plurality of semiconductor memories in accordance with external input signals comprising:

address bus buffer means for supplying an address signal to each of a plurality of semiconductor memories in accordance with an external input signal;

address decoder means for selectively setting a first of the semiconductor memories in a active state in accordance with the external input signal;

subaddress decoder means for selectively setting a second of the semiconductor memories having a memory capacity smaller than the first semiconductor memory in an active state in accordance with an output from said address decoder means and the address signal such that an address space of the second semiconductor memory is continuous with a memory space of the first semiconductor memory; and write signal control means for controlling storing of data in the semiconductor memories in response to the external input signal whereby said semiconductor memory controller can control said semiconductor memories having different memory capacities by dividing and assigning an address area assigned to one semiconductor memory in the active state to a plurality of other semiconductor memories having smaller memory capacities.

8. A semiconductor memory controller for controlling operation of a plurality of semiconductor memories in accordance with external input signals comprising:

address bus buffer means for supplying an address signal to each of a plurality of semiconductor memories in accordance with an external input signal;

address decoder means for selectively setting each of the semiconductor memories in an active state in accordance with the external input signal;

write signal control means for controlling storing of data in the semiconductor memories in response to the external input signal;

backup state control means for outputting a control signal for switching output levels of said address decoder means and said write signal control means in accordance with an external select signal when said controller changes states to a backup state;

three state output buffer means for outputting outputs from said address decoder means and said write signal control means in a high impedance state; and signal level fixing means for fixing at one of H level or L level all outputs of said address decoder means, said write signal control means, and said backup state control means when the outputs from said three state buffer means are set in the high impedance state, whereby said semiconductor memory controller can switch the outputs of said three state output buffer means in accordance with the semiconductor memories controlled.

9. The semiconductor memory controller according to claim 8 wherein said backup state control means includes a delay circuit for delaying and outputting the control signal for the external select signal, and wherein the control signal is supplied after the outputs of said three state output buffer means are changed to the output levels of said address decoder means and said write signal control means when said controller changes states to a stop state.

10. A semiconductor memory controller for controlling operation of a plurality of semiconductor memories in accordance with external input signals comprising:

address bus buffer means for supplying an address signal to each of a plurality of N-bit and 2N-bit semiconductor memories in accordance with an external input signal where N is an integer;

N-bit address decoder means for selectively setting each of the N-bit semiconductor memories in an active state in accordance with the external input signal;

2N-bit address decoder means for selectively setting each of the 2N-bit semiconductor memories in an active state in accordance with the external input signal such that an address space continuous with that for the N-bit semiconductor memories is formed for the 2N-bit memories;

subaddress decoder means for selectively setting a small semiconductor memory having a memory capacity smaller than said N-bit and 2N-bit semiconductor memories in an active state in accordance with one of outputs from said address decoder means and the address signal such than an address space for the small semiconductor memory is continuous with that for said N-bit and 2N-bit semiconductor memories;

write signal control means for controlling storing of data in the semiconductor memories in response to the external input signal;

pass through current preventing input buffer means for inputting the external input signal including a CMOS structure having a plurality of gates in which a pass through current does not flow even if an input signal level applied thereto changes, said pass through current preventing input buffer means being connected to an input of said address bus buffer means, said address decoder means, and said write signal control means;

operation state detecting means including a second CMOS structure having a plurality of gates for determining, based on the external input signal, whether said controller is to be set in an operation state and for setting outputs of said pass through current preventing input buffer means and said address bus buffer means to a GND level when said controller is to be set in a stop state;

backup state control means for delaying the select signal and outputting a control signal for switching output levels of said address decoder means and said write signal control means in accordance with an external select signal when said controller changes states to a backup state;

three state output buffer means for outputting outputs from said address decoder means and said write signal control means in a high impedance state and for receiving the control signal after outputs of said address decoder means and said write signal control means are set; and signal level fixing means for fixing at one of H level or L level all outputs of said address decoder means, said write signal control means, and said backup state control means when the outputs from said three state buffer means are set in the high impedance state.

* * * * *